United States Patent
Fujimura et al.

(10) Patent No.: US 9,104,109 B2
(45) Date of Patent: Aug. 11, 2015

(54) METHOD AND SYSTEM FOR IMPROVING CRITICAL DIMENSION UNIFORMITY USING SHAPED BEAM LITHOGRAPHY

(71) Applicant: D2S, Inc., San Jose, CA (US)

(72) Inventors: Akira Fujimura, Saratoga, CA (US); Ryan Pearman, San Jose, CA (US); Anatoly Aadamov, Palo Alto, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 14/069,376

(22) Filed: Nov. 1, 2013

(65) Prior Publication Data
US 2014/0127628 A1 May 8, 2014

Related U.S. Application Data

(60) Provisional application No. 61/722,042, filed on Nov. 2, 2012.

(51) Int. Cl.
| | |
|---|---|
| *G03F 7/20* | (2006.01) |
| *H01J 37/317* | (2006.01) |
| *H01J 37/302* | (2006.01) |
| *B82Y 10/00* | (2011.01) |
| *B82Y 40/00* | (2011.01) |

(52) U.S. Cl.
CPC .............. *G03F 7/2059* (2013.01); *B82Y 10/00* (2013.01); *B82Y 40/00* (2013.01); *G03F 7/20* (2013.01); *G03F 7/2051* (2013.01); *G03F 7/2065* (2013.01); *G03F 7/70533* (2013.01); *H01J 37/3026* (2013.01); *H01J 37/3174* (2013.01); *H01J 2237/31764* (2013.01); *H01J 2237/31776* (2013.01)

(58) Field of Classification Search
CPC ... G03F 7/2051; G03F 7/2059; G03F 7/2065; G03F 7/70533; H01J 37/3174; H01J 37/3026; H01J 2237/31764; H01J 2237/31776
USPC .................... 430/30, 296, 394, 942
See application file for complete search history.

(56) References Cited

U.S. PATENT DOCUMENTS

| | | | |
|---|---|---|---|
| 7,754,401 B2 | 7/2010 | Fujimura et al. | |
| 8,563,953 B2 * | 10/2013 | Nakayamada et al. | .. 250/492.23 |
| 2008/0116398 A1 | 5/2008 | Hara et al. | |
| 2012/0068089 A1 | 3/2012 | Nakayamada et al. | |

FOREIGN PATENT DOCUMENTS

| | | |
|---|---|---|
| EP | 1190434 B1 | 7/2008 |
| JP | 2002124454 A | 4/2002 |
| JP | 2011035298 A | 2/2011 |

OTHER PUBLICATIONS

Babin, S. et al., "Subfield Scheduling of Throughput Maximization in Electron-Beam Photomask Fabrication", Proceedings of SPIE, vol. 5037 (Jun. 13, 2003) pp. 934-942, SPIE, P.O. Box 10, Bellingham, WA. 98227, U.S.A.

Fujimura, A. et al., "Model-Based Mask Data Preparation (MB-MDP) and its impact on resist heating", Proceedings of SPIE, vol. 7970 (Apr. 4, 2011) pp. 797012-1-797012-10, SPIE, P.O. Box 10, Bellingham, WA. 98227, U.S.A.

International Search Report and Written Opinion dated Feb. 17, 2014 for PCT Application No. PCT/US2013/067904.

* cited by examiner

*Primary Examiner* — Christopher Young
(74) *Attorney, Agent, or Firm* — The Mueller Law Office, P.C.

(57) ABSTRACT

A method for forming a pattern on a surface using charged particle beam lithography is disclosed, where the shots in an ordered set of input shots are modified within a subfield to reduce either a thermal variation or a maximum temperature of the surface during exposure by the charged particle beam writer. A method for fracturing or mask data processing is also disclosed, where an ordered set of shots is generated which will expose at least one subfield of a surface using a shaped beam charged particle beam writer, and where a temperature or a thermal variation generated on the surface during the exposure of one subfield is calculated. Additionally, a method for forming a pattern on a surface with an ordered set of shots using charged particle beam lithography is disclosed, in which a blanking period following a shot is lengthened to reduce the maximum temperature of the surface.

20 Claims, 11 Drawing Sheets

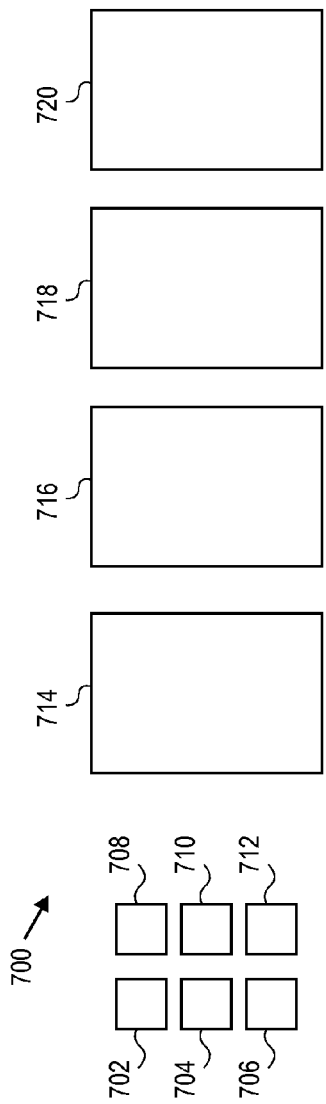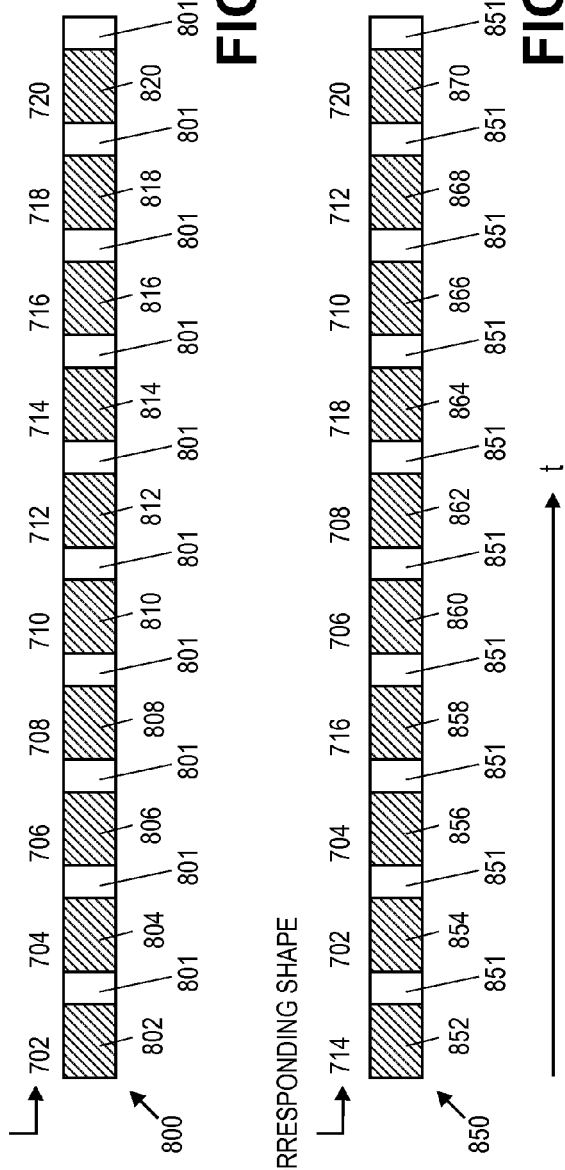

METHOD AND SYSTEM FOR IMPROVING CRITICAL DIMENSION UNIFORMITY USING SHAPED BEAM LITHOGRAPHY

This application claims priority to U.S. Provisional Patent Application Ser. No. 61/722,042 filed on Nov. 2, 2012 and entitled "Method and System For Improving Critical Dimension Uniformity Using Shaped Beam Lithography", which is hereby incorporated by reference for all purposes.

BACKGROUND OF THE DISCLOSURE

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays, holographic masks or even other reticles. While conventional optical lithography uses a light source having a wavelength of 193 nm, extreme ultra-violet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, directed self-assembly (DSA) guard bands, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection. Shaped beam charged particle beam lithography may use either a single shaped beam, or may use a plurality of shaped beams simultaneously exposing the surface, the plurality of shaped beams producing a higher writing speed than a single shaped beam.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application and incorporated by reference for all purposes, discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

SUMMARY OF THE DISCLOSURE

A method for forming a pattern on a surface using charged particle beam lithography is disclosed, where the shots in an ordered set of input shots are modified within a subfield to reduce either a thermal variation or a maximum temperature of the surface during exposure by the charged particle beam writer.

A method for forming a pattern on a surface using charged particle beam lithography is also disclosed, in which an ordered set of input shots is input, and in which a blanking period following a shot is lengthened to reduce the maximum temperature of the surface.

A method for fracturing or mask data processing (MDP) is also disclosed, where an ordered set of shots is generated which will expose at least one subfield of a surface using a shaped beam charged particle beam writer, and where a temperature or a thermal variation generated on the surface during the exposure of one subfield is calculated.

BRIEF DESCRIPTION OF THE DRAWINGS

FIG. 7 illustrates an example of a group of patterns to be formed in a subfield;

FIG. 8A illustrates an example of a shot timing diagram for a sequence of shots that will form the patterns of FIG. 7;

FIG. 8B illustrates an example of a shot timing diagram for an exemplary sequence of shots that will form the patterns of FIG. 7 according to one embodiment;

DETAILED DESCRIPTION OF THE EMBODIMENTS

Figure 1:
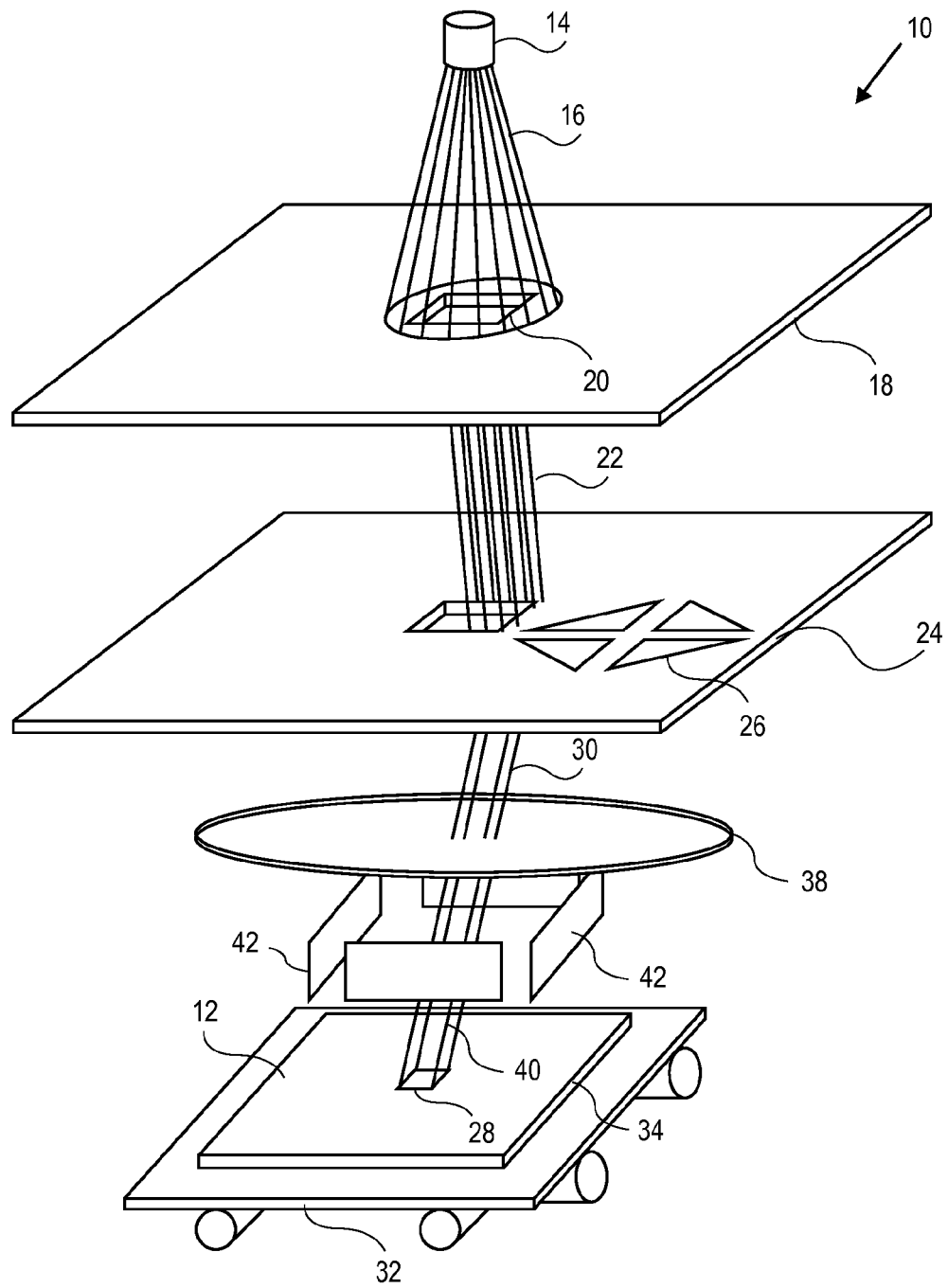
FIG. 1 illustrates an example of a variable shaped beam (VSB) charged particle beam system.

The present disclosure is related to lithography, and more particularly to the design and manufacture of a surface which may be a reticle, a wafer, or any other surface, using charged particle beam lithography.

As the size of shapes that are to be formed on a surface such as a reticle decreases in newer fabrication technologies, higher precision resists are being used to form these patterns. The sensitivity of these higher-precision resists is lower than for resists used for larger fabrication technologies. For example, common resists may have a sensitivity of 15 uC/cm$^2$, but higher-precision resists more typically have a 25 uC/cm$^2$ sensitivity. Even lower sensitivity resists, including some resists where sensitivity is >100 uC/cm$^2$, are already used for some specific high-accuracy applications. The higher dosage required by the lower-sensitivity resists increases reticle write times. To help reduce this increase in write time caused by the lower-sensitivity resists, newer charged particle beam writers are being developed which allow larger maximum currents. Whereas most electron beam writers currently in use support maximum current densities in the 10-400 uA/cm$^2$ range, even higher current densities are anticipated in future generations of charged particle beam writers.

The charged particles from a charged particle beam shot heat up the resist and the substrate on which the resist is coated. Higher-current charged particle beam writers can provide a given shot dosage to a substrate such as a reticle in a shorter period of time than lower-current charged particle beam writers, thereby causing a higher temperature increase on the resist and the substrate upon which the resist is coated. Since various manufacturing conditions such as a resist's threshold, that is the dosage at which the resist will register a pattern, are temperature dependent, the larger temperature increase will increase the observed critical dimension (CD) variation of a pattern formed using a higher-current charged particle beam writer, compared to use of a lower-current charged particle beam writer. Similarly, any charged particle beam exposure writer or method which increases the temperature range or thermal variation of the substrate during the writing process, will increase the CD variation observed in the pattern formed on the substrate.

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce CD variation due to thermal effects. Multi-pass writing also averages out random errors of the charged particle beam writer. Multi-pass writing using different shot lists for different exposure passes can also reduce the effects of certain systemic errors in the writing process.

Referring now to the drawings, wherein like numbers refer to like items, FIG. 1 illustrates an embodiment of a lithography system, such as a charged particle beam writer system, in this case an electron beam writer system 10, that employs a variable shaped beam (VSB) to manufacture a surface 12. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil 24 has formed therein a number of openings or apertures 26 that define various simple shapes such as rectangles and triangles. Each aperture 26 formed in the stencil 24 may be used to form a pattern in the surface 12 of a substrate 34, such as a silicon wafer, a reticle or other substrate. An electron beam 30 emerges from one of the apertures 26 and passes through an electromagnetic or electrostatic reduction lens 38, which reduces the size of the pattern emerging from the aperture 26. In commonly available charged particle beam writer systems, the reduction factor is between 10 and 60. The reduced electron beam 40 emerges from the reduction lens 38 and is directed by a series of deflectors 42 onto the surface 12 as a pattern 28. The surface 12 is coated with resist (not shown) which reacts with the electron beam 40. The electron beam 22 may be directed to overlap a variable portion of an aperture 26, affecting the size and shape of the pattern 28. Blanking plates (not shown) are used to deflect the beam 16 or the shaped beam 22 so to prevent the electron beam from reaching the surface 12 during a period after each shot when the lenses directing the beam 22 and the deflectors 42 are being re-adjusted for the succeeding shot. Typically the blanking plates are positioned so as to deflect the electron beam 16 to prevent it from illuminating aperture 20. Conventionally, the blanking period may be a fixed length of time, or it may vary depending, for example, on how much the deflector 42 must be re-adjusted for the position of the succeeding shot.

In electron beam writer system 10, the substrate 34 is mounted on a movable platform or stage 32. The stage 32 allows substrate 34 to be repositioned so that patterns which are larger than the maximum deflection capability or field size of the charged particle beam 40 may be written to surface 12 in a series of subfields, where each subfield is within the capability of deflector 42 to deflect the beam 40. In one embodiment the substrate 34 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 28, generally reduced in size, onto a silicon wafer to produce an integrated circuit. More generally, the mask is used in another device or machine to transfer the pattern 28 on to a substrate (not illustrated).

Figure 2:
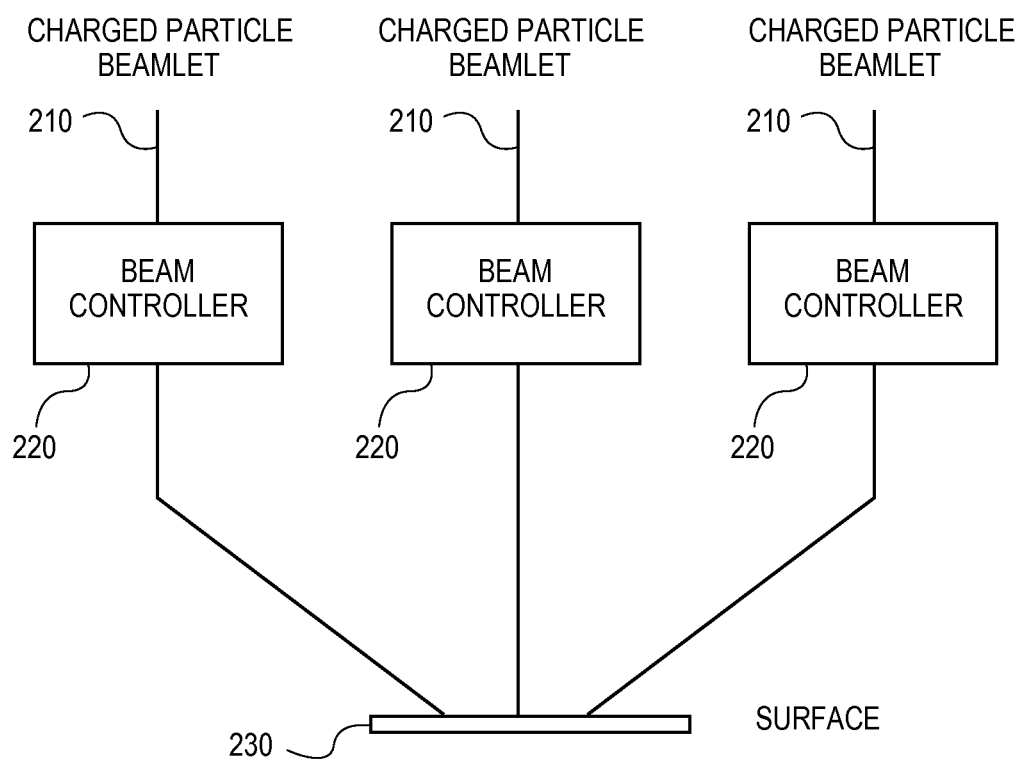
FIG. 2 illustrates an example of an electro-optical schematic diagram of a multi-beam exposure system.

A charged particle beam system may expose a surface with a plurality of individually-controllable beams or beamlets. FIG. 2 illustrates an electro-optical schematic diagram in which there are three charged particle beamlets 210. Associated with each beamlet 210 is a beam controller 220. Beam controller 220 can, for example, allow its associated beamlet 210 to strike surface 230, and can also prevent beamlet 210 from striking the surface 230. In some embodiments, beam controller 220 may also control beam blur, magnification, size and/or shape of beamlet 210. In this disclosure, a charged particle beam system which has a plurality of individually-controllable beamlets is called a multi-beam system. In some embodiments, charged particles from a single source may be sub-divided to form a plurality of beamlets 210. In other embodiments a plurality of sources may be used to create the plurality of beamlets 210. In some embodiments, beamlets 210 may be shaped by one or more apertures, whereas in other embodiments there may be no apertures to shape the beamlets. Each beam controller 220 may allow the period of exposure of its associated beamlet to be controlled individually. Generally the beamlets will be reduced in size by one or more lenses (not shown) before striking the surface 230. In some embodiments each beamlet may have a separate electro-optical lens, while in other embodiments a plurality of beamlets, including possibly all beamlets, will share an electro-optical lens.

Figure 3A:
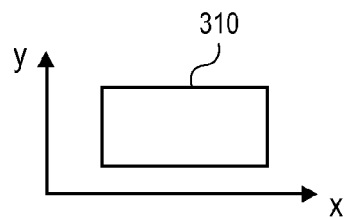
FIG. 3A illustrates an example of a rectangular shot.
Figure 3B:
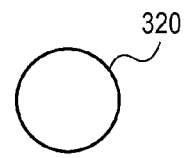
FIG. 3B illustrates an example of a circular character projection shot.
Figure 3C:
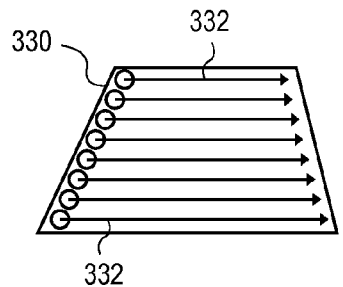
FIG. 3C illustrates an example of a trapezoidal shot.
Figure 3D:
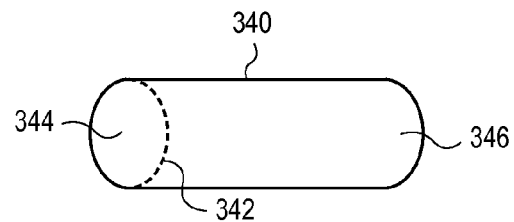
FIG. 3D illustrates an example of a dragged shot.

For purposes of this disclosure, a shot is the exposure of some surface area over a period of time. The area may be comprised of multiple discontinuous smaller areas. A shot may be comprised of a plurality of other shots which may or may not overlap, and which may or may not be exposed simultaneously. A shot may comprise a specified dose, or the dose may be unspecified. Shots may use a shaped beam, an unshaped beam, or a combination of shaped and unshaped beams. FIG. 3 illustrates some various types of shots. FIG. 3A illustrates an example of a rectangular shot 310. A VSB charged particle beam system can, for example, form rectangular shots in a variety of x and y dimensions. FIG. 3B illustrates an example of a character projection (CP) shot 320, which is circular in this example. FIG. 3C illustrates an example of a trapezoidal shot 330. In one embodiment, shot 330 may be a created using a raster-scanned charged particle beam, where the beam is scanned, for example, in the x-direction as illustrated with scan lines 332. FIG. 3D illustrates an example of a dragged shot 340, disclosed in U.S. Patent Application Publication 2011-00890345. Shot 340 is formed by exposing the surface with a curvilinear shaped beam 342 at an initial reference position 344, and then moving the shaped beam across the surface from position 344 to position 346. A dragged shot path may be, for example, linear, piecewise linear, or curvilinear.

Figure 3E:
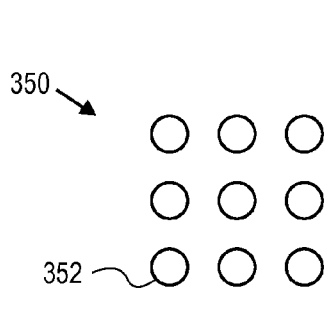
FIG. 3E illustrates an example of a shot which is an array of circular patterns.
Figure 3F:
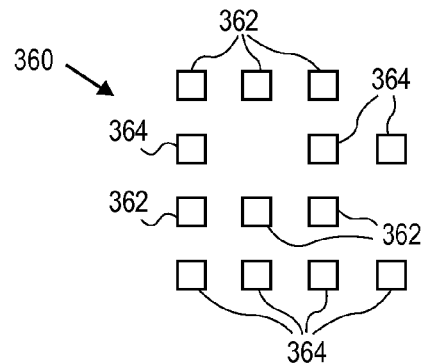
FIG. 3F illustrates an example of a shot which is a sparse array of rectangular patterns.

FIG. 3E illustrates an example of a shot 350 that is an array of circular patterns 352. Shot 350 may be formed in a variety of ways, including multiple shots of a single circular CP character, one or more shots of a CP character which is an array of circular apertures, and one or more multi-beam shots using circular apertures. FIG. 3F illustrates an example of a shot 360 that is a sparse array of rectangular patterns 362 and 364. Shot 360 may be formed in a variety of ways, including a plurality of VSB shots, a CP shot, and one or more multi-beam shots using rectangular apertures. In some embodiments of multi-beam, shot 360 may comprise a plurality of interleaved groups of other multi-beam shots. For example, patterns 362 may be shot simultaneously, then patterns 364 may be shot simultaneously at a time different from patterns 362.

Figure 4:
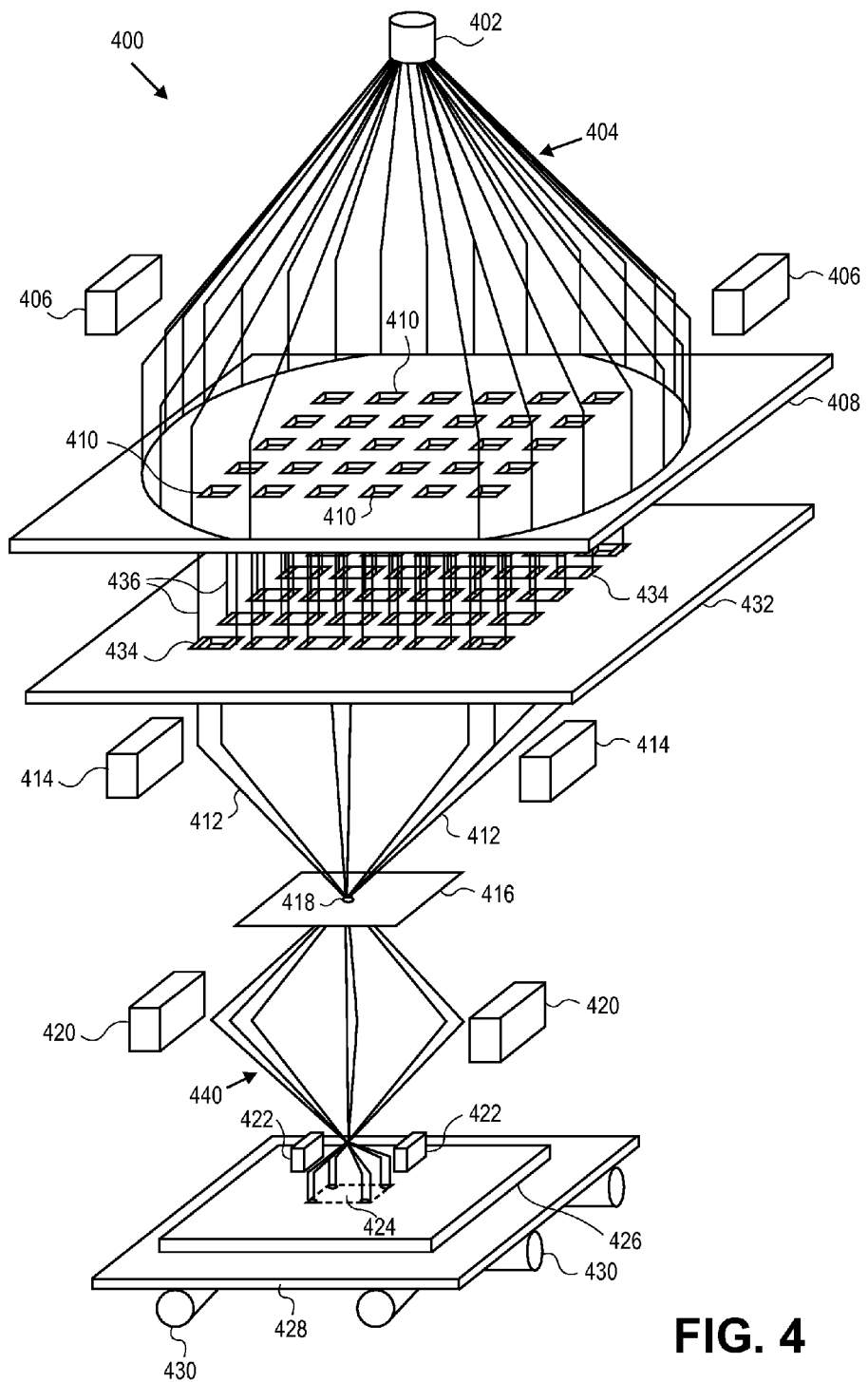
FIG. 4 illustrates an example of a multi-beam charged particle beam system.

FIG. 4 illustrates an embodiment of a charged particle beam exposure system 400. Charged particle beam system 400 is a multi-beam system, in which a plurality of individually-controllable shaped beams can simultaneously expose a surface. Multi-beam system 400 has an electron beam source 402 that creates an electron beam 404. The electron beam 404 is directed toward aperture plate 408 by condenser 406, which may include electrostatic and/or magnetic elements. Aperture plate 408 has a plurality of apertures 410 which are illuminated by electron beam 404, and through which electron beam 404 passes to form a plurality of shaped beamlets 436. In some embodiments, aperture plate 408 may have hundreds or thousands of apertures 410. Although FIG. 4 illustrates an embodiment with a single electron beam source 402, in other embodiments apertures 410 may be illuminated by electrons from a plurality of electron beam sources. Apertures 410 may be rectangular, or may be of a different shape, for example circular. The set of beamlets 436 then illuminates a blanking controller plate 432. The blanking controller plate 432 has a plurality of blanking controllers 434, each of which is aligned with a beamlet 436. Each blanking controller 434 can individually control its associated beamlet 436, so as to either allow the beamlet 436 to strike surface 424, or to prevent the beamlet 436 from striking the surface 424. The amount of time for which the beam strikes the surface controls the total energy or "dose" applied by that beamlet. Therefore, the dose of each beamlet may be independently controlled.

In FIG. 4 beamlets that are allowed to strike surface 424 are illustrated as beamlets 412. In one embodiment, the blanking controller 434 prevents its beamlet 436 from striking the surface 424 by deflecting beamlet 436 so that it is stopped by an aperture plate 416 which contains an aperture 418. In some embodiments, blanking plate 432 may be directly adjacent to aperture plate 408. In other embodiments, the relative locations of aperture plate 408 and blanking controller 432 may be reversed from the position illustrated in FIG. 4, so that beam 404 strikes the plurality of blanking controllers 434. A system of lenses comprising elements 414, 420, and 422 allows projection of the plurality of beamlets 412 onto surface 424 of substrate 426, typically at a reduced size compared to the plurality of apertures 410. The reduced-size beamlets form a beamlet group 440 which strikes the surface 424 to form a pattern that matches the pattern of the apertures 410, which are allowed to strike surface 424 by blanking controllers 434. In FIG. 4, beamlet group 440 has four beamlets illustrated for forming a pattern on surface 424.

Substrate 426 is positioned on movable platform or stage 428, which can be repositioned using actuators 430. By moving stage 428, beam 440 can expose an area larger than the dimensions of the maximum size pattern formed by beamlet group 440, using a plurality of exposures or shots. In some embodiments, the stage 428 remains stationary during an exposure, and is then repositioned for a subsequent exposure. In other embodiments, stage 428 moves continuously and at a variable velocity. In yet other embodiments, stage 428 moves continuously but at a constant velocity, which can increase the accuracy of the stage positioning. For those embodiments in which stage 428 moves continuously, a set of deflectors (not shown) may be used to move the beam to match the direction and velocity of stage 428, allowing the beamlet group 440 to remain stationary with respect to surface 424 during an exposure. In still other embodiments of multi-beam systems, individual beamlets in a beamlet group may be deflected across surface 424 independently from other beamlets in the beamlet group.

Other types of multi-beam systems may create a plurality of unshaped beamlets 436, such as by using a plurality of charged particle beam sources to create an array of Gaussian beamlets.

Referring again for FIG. 1, the minimum size pattern that can be projected with reasonable accuracy onto a surface 12 is limited by a variety of short-range physical effects associated with the electron beam writer system 10 and with the surface 12, which normally comprises a resist coating on the substrate 34. These effects include forward scattering, Coulomb effect, and resist diffusion. Beam blur, also called $\beta_f$, is a term used to include all of these short-range effects. The most modern electron beam writer systems can achieve an effective beam blur radius or $\beta_f$ in the range of 20 nm to 30 nm. Forward scattering may constitute one quarter to one half of the total beam blur. Modern electron beam writer systems contain numerous mechanisms to reduce each of the constituent pieces of beam blur to a minimum. Since some components of beam blur are a function of the calibration level of a particle beam writer, the $\beta_f$ of two particle beam writers of the same design may differ. The diffusion characteristics of resists may also vary. Variation of $\beta_f$ based on shot size or shot dose can be simulated and systemically accounted for. But there are other effects that cannot or are not accounted for, and they appear as random variation.

The shot dosage of a charged particle beam writer such as an electron beam writer system is a function of the intensity of the beam source 14 and the exposure time for each shot. Typically the beam intensity remains fixed, and the exposure time is varied to obtain variable shot dosages. Different areas in a shot may have different exposure times, such as in a multi-beam shot. The exposure time may be varied to compensate for various long-range effects such as backscatter, fogging, and loading effects in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before PEC. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels.

Conventionally, shots are designed so as to completely cover an input pattern with rectangular shots, while avoiding shot overlap wherever possible within an exposure pass. Also, all shots are designed to have a normal dosage, which is a dosage at which a relatively large rectangular shot, in the absence of long-range effects, will produce a pattern on the surface which is the same size as is the shot size. Some electron beam writer systems enforce this methodology by not allowing shots to overlap within an exposure pass.

Each shot heats up both the resist and the substrate upon which the resist is coated. The resist in the vicinity of a shot heats up quickly during a shot, but also cools quickly during the blanking period following the shot. The substrate, which is typically quartz in the case of reticles for conventional optical lithography, heats up more slowly. In practice, substrate heating is a bigger issue than resist heating if a subfield contains a high density of shots. Substrate heating from previous shots will affect the resist temperature at the start of a shot. Since the resist threshold is temperature dependent, changes in the resist temperature at the start of a shot will affect the CD of the developed pattern on the surface of the substrate. Prior art results show that the CD can change by 4 nm or more due to thermal effects. This amount of thermally-induced CD variation is often considered unacceptably high, given that a total permissible CD variation from all sources combined may be, for example, 1-2 nm.

Since thermally-induced CD variation is caused by the change in resist threshold with temperature, the CD variation can be reduced by reducing temperature variation of the resist-coated substrate during writing. Reducing this temperature variation can be done with techniques that reduce the maximum substrate temperature. The temperature variation can also be reduced by raising the minimum resist temperature, using techniques which create a more even rate of energy delivery to the resist and substrate. In writing a pattern on a resist-coated substrate using charged particle beam lithography, intra-subfield temperature variation and inter-subfield temperature variation are both important. Intra-subfield temperature variation is the variation of substrate temperature while writing patterns within a single subfield. Inter-subfield temperature variation is the variation of substrate temperature while writing a plurality of subfields that together form a complete pattern. Inter-subfield temperatures depend on the order in which the subfields are written. The current disclosure focuses on reducing temperature variation while not modifying the subfield writing order.

Conventionally, the highest-precision patterns are written by using 2-4 exposure passes. Multi-pass exposure produces multiple benefits:

Subfield-to-subfield repositioning involves physical movement of the mask stage. This positioning is subject to random positional errors, leading to stitching error where a pattern is partially exposed in one subfield and partially in another subfield. Use of multiple exposure passes, using different subfield gridding for each pass, will reduce the effect of stitching error.

Each charged particle beam shot has a statistical variation in its position, angle dosage, and in the case of VSB shots and partially projected CP shots, shot size. When a plurality of shots is written on top of each other in multiple exposure passes, these statistical variations are relatively uncorrelated among the overlapping shots, producing a more accurate pattern after resist development.

Use of multiple exposure passes increases the exposure time, overall reducing the effects of thermally-induced CD variation. The total beam-on time, which is the time during which the unblanked beam exposes the resist, remains constant for any number of exposure passes, but the total blanking time increases, and the subfield repositioning time increases as the number of exposure passes is increased. Additionally, using 2 exposure passes, for example, the total dosage delivered to a localized area such as a subfield is half of the dosage when using a single exposure pass. The subfield or localized area then cools before being exposed again in a subsequent exposure pass. The reduction in thermally-induced CD variation is therefore greater than the increase in exposure time might suggest.

Figure 5:
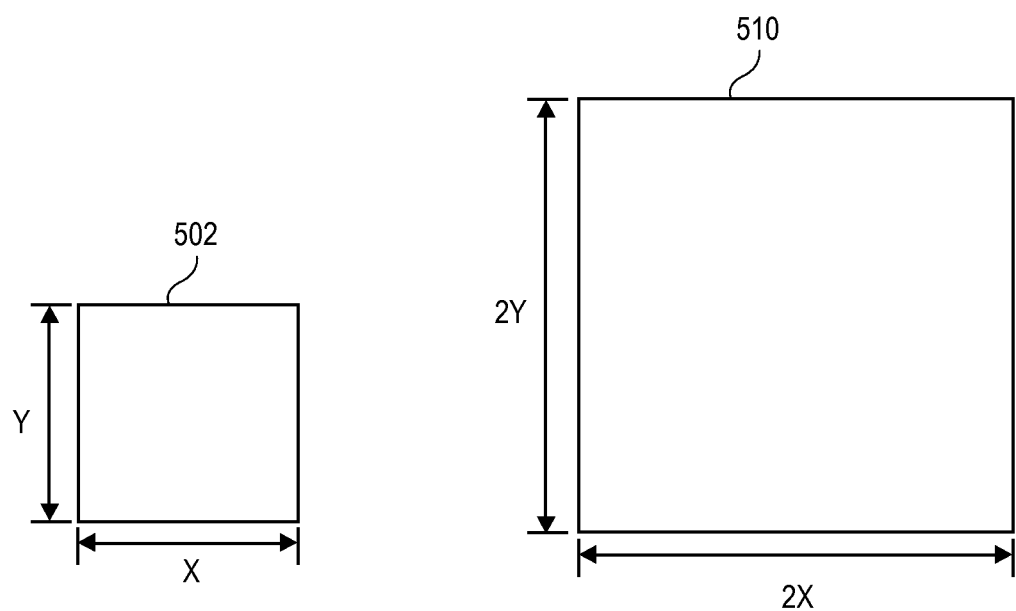
FIG. 5 illustrates an example of a pair of patterns to be formed on a resist-coated substrate surface.

The localized mask heating depends both on the shot dosage and on the area of the shot. FIG. 5 illustrates two patterns 502 and 510. Pattern 502 has an area of x*y units. Pattern 510 has an area of 2x*2y units. Each of patterns 502 and 510 can be conventionally exposed with a single rectangular VSB shot of normal dosage. Since the area of pattern 510 is 4 times (4×) the area of pattern 502, the heating effect of a normal dosage shot exposing pattern 510 will be 4× as much as the heating effect of a normal dosage shot exposing pattern 502.

FIGS. 6A-F illustrate examples of the relative time requirements for exposing the two patterns 502 and 510 using VSB shots with various numbers of exposure passes. FIGS. 6A-F illustrate shot timing diagrams. In these shot timing diagrams the x-axis represents time. Exposure periods or shots are illustrated using cross-hatched rectangles, and blanking periods are illustrated with unfilled rectangles. The width of the rectangles represents the duration of the shots and blanking periods. The height of the rectangles is not significant, and is for illustration purposes only. In FIGS. 6A-6E all blanking periods have the same duration. The various widths of the cross-hatched rectangles represent shots of different temporal duration and therefore different dosages.

Figure 6A:
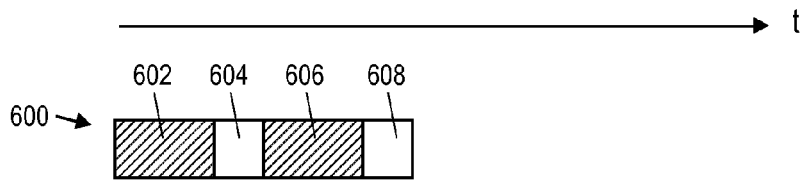
FIG. 6A illustrates an example of a shot timing diagram for a set of shots that may be generated to form the patterns of FIG. 5.

FIG. 6A illustrates an example of a shot sequence or ordered set of shots 600, which comprises two shots: shot 602 and shot 606, which are normal dosage shots that can form the patterns 502 and 510 in a single exposure pass. Shot 602 forms pattern 502 and shot 606 forms pattern 510. Shot 602 is followed by blanking period 604, and shot 606 is followed by blanking period 608. Since the pattern 510 is 4× as large as the pattern 502, the shot 606 will transfer about 4× as much energy to the resist and substrate in the vicinity of pattern 510, compared to the energy transferred to the resist and the substrate in the vicinity of pattern 502 by shot 602. For the purposes of this example, it will be assumed that thermal calculations have determined that the shot 606, in combination with nearby shot 602, will produce excessive thermally-induced CD variation on the final substrate pattern.

Figure 6B:
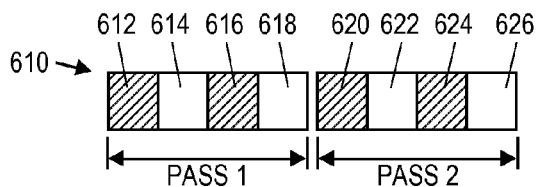
FIG. 6B illustrates an example of a shot timing diagram for a sequence of shots that may be generated to form the patterns of FIG. 5 using two exposure passes.

FIG. 6B illustrates an example of a conventional method of reducing the thermal problem by using two exposure passes. Shot sequence 610 comprises shot 612 and shot 616 in a first exposure pass, and shot 620 and shot 624 are in a second exposure pass. Shot 612 is followed by blanking period 614, shot 616 is followed by blanking period 618, shot 620 is followed by blanking period 622, and shot 624 is followed by blanking period 626. Shots 612, 616, 620 and 624 each have a duration, and therefore a dosage, of about ½ the duration of shots 602 and 606, before PEC. Shots 612 and 620, which expose pattern 502, are the same size as shot 602, and shots 612 and 620 are coincident. Shots 616 and 624, which expose pattern 510, are the same size as shot 606, and shots 616 and 624 are coincident. Note that the total time for shot sequence 610, as represented by the x-axis length, is longer than the total time of the shot sequence 600, due to the increased total blanking time from the larger number of blanking periods. Subfield repositioning time, which is not illustrated in FIG. 6, will also be higher with two exposure passes than with a single exposure pass. The double-exposure of pattern 510 using shot sequence 610 reduces the thermally-induced CD variation of the formed pattern 510 because the normal dosage is applied to the resist over a longer period of time, compared to shot sequence 600.

Figure 6C:
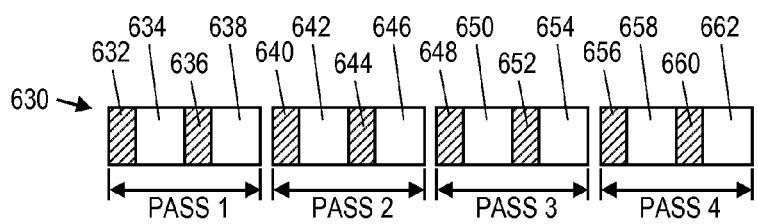
FIG. 6C illustrates an example of a shot timing diagram for a sequence of shots that may be generated to form the patterns of FIG. 5 using four exposure passes.

FIG. 6C illustrates an example of how the conventional multi-pass exposure technique may be carried further, by using four exposures passes. Each shot in FIG. 6C shot sequence 630 is approximately one-quarter the dose of a shot in shot sequence 600, before PEC. Shots 632 and 636 are in the first exposure pass, along with blanking periods 634 and 638. Shots 640 and 644 are in the second exposure pass, along with blanking periods 642 and 646. Shots 648 and 652 are in the third exposure pass, along with blanking periods 650 and 654. Shots 656 and 660 are in the fourth exposure pass, along with blanking periods 658 and 662. Shots 632, 640, 648 and 656 are coincident and expose pattern 502. Shots 636, 644, 652, and 660 are coincident and expose pattern 510. As can be seen, shot sequence 630 requires more time than shot sequence 610, because of the larger number of blanking periods in shot sequence 630. The thermal heating of the resist and substrate using shot sequence 630 will be even less than when using shot sequence 610, because the dosage is applied over a longer time period in shot sequence 630 compared to shot sequence 610. In particular, in shot sequence 630 there is more time between the beginning of 636, the first shot for pattern 510, and the end of shot 660, the last shot for pattern 510, than there is time between the beginning of shot 616 and the end of shot 624 in shot sequence 610.

As explained above, the increase in write time associated with increasing the number of exposure passes reduces resist and substrate heating. But increased write time also has negative consequences:

Since the charged particle beam writer is very expensive, increasing the total write time significantly increases cost of the manufactured substrate, such as a photomask.

The charged particle beam writer is subject to calibration drift and other reliability issues that affect the yield of good patterns. Increased write times may therefore reduce yield of the substrate manufacturing process. For sufficiently complex patterns, doubling the number of exposure passes may increase the write time beyond the time when the machine remains in acceptable calibration, which may be, for example, about 48 hours.

The increased write time delays the delivery of the manufactured substrate, for example a photomask.

Although pattern accuracy, which CD variation affects, is the most important goal in particle beam lithography, minimizing write time is also important because of the above-listed consequences of increased write time. Methods that minimize write time while keeping CD variation below a pre-determined limit are therefore most desirable. Since doubling the number of exposure passes affects all shots, both the large shots that may be causing thermal problems and the smaller shots which are less likely to cause problems, increasing the number of exposure passes as a method of addressing localized substrate heating is not the most efficient way to reduce thermally-induced CD variation. If, for example, most shots on a layer are small shots, increasing the number of exposure passes to reduce thermally-induced CD variation is very inefficient in write time.

The current embodiments described below provide different solutions for addressing localized substrate heating. Shots which cause heating problems can be identified in the sequenced shot list, and each of these problem shots can be re-ordered. Alternatively or additionally, the problem shot can be split into a plurality of lower-dosage shots so as to reduce the heating. In some embodiments, each problem shot is replaced with a plurality of shots of the same size as the original problem shot, but with the replacement shots being shot at a dosage of approximately 1/n as much as the original problem shot dosage, where "n" is the number of replacement shots. In one embodiment, the replacement shots are exposed sequentially. In another embodiment, the shot sequence or order is changed so as to interpose one or more unrelated shots between two of the replacement shots. In some embodiments, the interposing shot(s) will be small so as to not put much additional energy into the resist and substrate. The interposing shot(s) may also be at a relatively distant location in the subfield from the replacement shots. Note that in some charged particle beam writers, the blanking time may be longer when the distance between successive shots is higher. In some embodiments, this shot replacement process is a shot list post-processing step after fracturing/mask data processing (MDP) has been done. In other embodiments the fracturing or MDP step itself comprises calculation of resist and substrate heating while generating the original shot list, and generation of multiple overlapping shots where use of fewer higher-dosage shots would cause excessive thermally-induced CD variation.

Figure 6D:
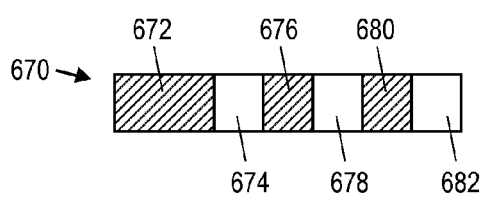
FIG. 6D illustrates an example of a shot timing diagram for an exemplary sequence of shots that may be generated to form the patterns of FIG. 5, in one embodiment.

Embodiments of these methods may be illustrated using the patterns of FIG. 5. FIG. 6D illustrates a shot timing diagram of shot sequence 670 which comprises three shots. Shot 672 is a normal dosage which will write the smaller pattern 502 in a single shot. Shots 676 and 680 are approximately ½ normal dosage and will write the larger pattern 510 using two coincident exposures. Shot 672 is followed by blanking period 674. Shot 676 is followed by blanking period 678, and shot 680 is followed by blanking period 682. An advantage of shot sequence 670 compared to multi-pass shot sequence 610 is that in shot sequence 670, pattern 502 is exposed in a single shot, thereby reducing write time compared to shot sequence 610 where pattern 502 is exposed using coincident shots 612 and 620. Pattern 502 is sufficiently small that thermally-induced CD variation is not a problem when it is exposed when using a single shot. Shot sequence 670 uses two coincident shots to expose pattern 510, which as explained above, has excessive thermally-induced CD variation when exposed in a single shot as in shot sequence 600. If the shot sequence 670 provides enough heat-dissipation time in the vicinity of pattern 510 so as to keep thermally-induced CD variation below the predetermined acceptable maximum, then shot sequence 670 is preferred over shot sequence 610 because of the faster write time for shot sequence 670 compared to shot sequence 610.

Figure 6E:
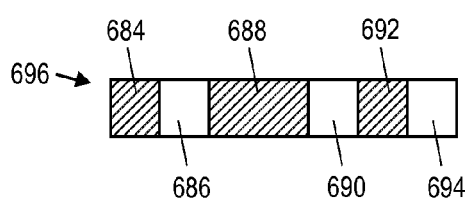
FIG. 6E illustrates another example of a shot timing diagram for an exemplary sequence of shots that may be generated to form the patterns of FIG. 5, in another embodiment.

FIG. 6E illustrates another embodiment for writing FIG. 5 patterns 502 and 510. The shot sequence 696 of FIG. 6E is comprised of three shots. Shots 684 and 692, which are approximately ½ normal dosage and which are coincident, write the pattern 510. Shot 688 is normal dosage and writes pattern 502 in a single shot. Shot 684 is followed by blanking period 686. Shot 688 is followed by blanking period 690. Shot 692 is followed by blanking period 694. As can be seen, the write time for shot sequence 696 is the same as for shot sequence 670. Compared to shot sequence 670, in shot sequence 696 the two shots 684 and 692 which expose pattern 510 are separated temporally by interposing shot 688, thereby allowing the resist and substrate in the vicinity of pattern 510 more time to cool between the two shots used to expose pattern 510, reducing thermal variation. If using charged particle beam writers for which blanking periods are of constant length, as is illustrated in FIG. 6A-E, the shot sequence 696 is therefore preferred over shot sequence 670. If using a charged particle beam writer for which the length of the blanking period depends on, for example, the distance between the shots surrounding the blanking period, the choice of shot sequence between 670 and 696 depends on the extra write time for shot sequence 696, if any, and whether the extra time between shots 684 and 692 that shot sequence 696 provides is needed to maintain thermally-induced CD variation below the predetermined maximum acceptable value.

Figure 6F:
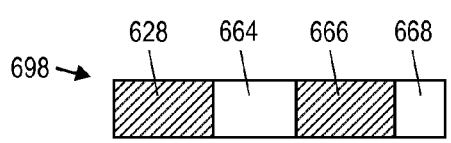
FIG. 6F illustrates another example of a shot timing diagram for an exemplary sequence of shots that may be generated to form the patterns of FIG. 5, in yet another embodiment.

FIG. 6F illustrates another embodiment using the same two patterns of FIG. 5. The shot sequence 698 of FIG. 6F is comprised of two shots. Shot 628 is normal dosage and will write pattern 510 in a single shot. Shot 666 is normal dosage and writes pattern 502 in a single shot. Shot 628 is followed by blanking period 664. Shot 666 is followed by blanking period 668. As can be seen, blanking period 664 is longer than blanking period 668. In fact, blanking period 664 is longer than is needed to re-position the charged particle beam deflector for shot 666. Blanking period 664 has been lengthened to allow more time for the resist and substrate to cool after large shot 628. Shot sequence 698 is another alternative method of providing extra cool-down time in a shot sequence, to reduce maximum substrate temperature and thermal variation.

The methods of the current embodiments may also be employed when using multi-pass exposure techniques. For example, two exposure passes may be desired so as to reduce stitching error. Using the patterns of FIG. 5 as an example, if thermally-induced CD variation for pattern 510 will be above the predetermined maximum acceptable value using two exposure passes such as in shot sequence 610, then the shot sequence 670 can be employed in each of the two exposures passes, with the dosage of all shots cut by ½ compared to using shot sequence 670 in a single exposure pass as described above. In this case pattern 502 will be exposed by two shots, including one shot in each of two exposures passes, and pattern 510 will be exposed by four shots, including two shots in each of two exposure passes. This technique will result in a total write time which is less than the write time for conventional four-pass exposure as illustrated in shot sequence 630.

Some embodiments as set forth above require that the charged particle beam writer allow shot overlap within an exposure pass. Some charged particle beam writers do not allow shot overlap within an exposure pass.

In another embodiment, re-ordering a set of shots can reduce the thermally-induced CD variation, without increasing the number of shots. For example, an original shot list may be ordered so that the largest shots in a subfield are temporally grouped. Since, with constant dosage, large shots heat up the resist and the substrate more than small shots, a plurality of temporally-grouped large shots will cause a relatively large thermal variation and a relatively large maximum temperature in the substrate. Breaking up the group of large shots by interposing one or more small shots between each pair of large shots will reduce the resist and substrate temperature variation, which will reduce the thermally-induced CD variation. Breaking up the group of large shots will also reduce the maximum substrate temperature.

FIG. 7 illustrates an example of a set of patterns 700 which comprises six small patterns and four larger patterns, such as for one subfield. Patterns 702, 704, 706, 708, 710 and 712 are small. Patterns 714, 716, 718 and 720 are larger. If a single normal-dosage shot is used to expose each pattern, each large pattern shot will produce more resist and substrate heating than each small pattern shot. FIG. 8A illustrates an example of a shot timing diagram 800 of a conventional shot sequence that may be used to expose the set of patterns 700. Shot sequence 800 comprises 10 shots—one shot to expose each pattern in set of patterns 700. Each shot in shot sequence 800 is followed by a blanking period 801. Shot 802 writes small pattern 702, shot 804 writes small pattern 704, shot 806 writes small pattern 706, shot 808 writes small pattern 708, shot 810 writes small pattern 710, and shot 812 writes small pattern 712. Shot 814 writes large pattern 714, shot 816 writes large pattern 716, shot 818 writes large pattern 718, and shot 820 writes large pattern 720. If all shots in shot sequence 800 are sufficiently close to each other such that substrate heating from any shot in the sequence affects all subsequent shots, then exposure of shot sequence 800 will produce a relatively high temperature variation on the resist-coated substrate, due to the small shots being clustered at the first part of the shot sequence, and the large shots being clustered at the later portion of the shot sequence. Since each larger shot imparts much more energy to the resist and substrate than does each small shot, the temperature of the substrate will rise much higher toward the end of the shot sequence than at the beginning, creating a relatively large temperature variation.

FIG. 8B illustrates an example of a shot timing diagram of an exemplary shot sequence 850 that may be used to expose the set of patterns 700 according to one embodiment. Shot sequence 850 comprises 10 shots—one shot to expose each pattern in set of patterns 700. Each shot in shot sequence 850 is followed by a blanking period 851. Shot 852 writes large pattern 714, shot 854 writes small pattern 702, and shot 856 writes small pattern 704. Continuing, shot 858 writes large pattern 716, shot 860 writes small pattern 706, and shot 862 writes small pattern 708. Continuing, shot 864 writes large pattern 718, shot 866 writes small pattern 710, shot 868 writes small pattern 712, and shot 870 writes large pattern 720. As can be seen, the shots in shot sequence 850 are ordered so as to place two small shots between each large shot. Shot sequence 850 will produce a lower maximum substrate temperature than shot sequence 800. Additionally, shot sequence 850 produces a higher minimum temperature than shot sequence 800 for every shot after shot 852, since large shot 852 imparts more energy to the substrate subfield area than does the initial shot 802 of shot sequence 800. Overall thermal variation is therefore less for shot sequence 850, leading to lower thermally-induced CD variation. Shot sequence 850 will produce a smaller CD variation due to thermal variation than will shot sequence 800.

The resist temperature and/or the substrate temperature may be calculated via simulation. Such simulation must know not only the shot list itself, but the planned shooting order. Some charged particle beam writers may re-order the shots in an input shot list, in which case the simulator must be able to determine the shot sequence that will be used by the charged particle beam writer.

Figure 9:
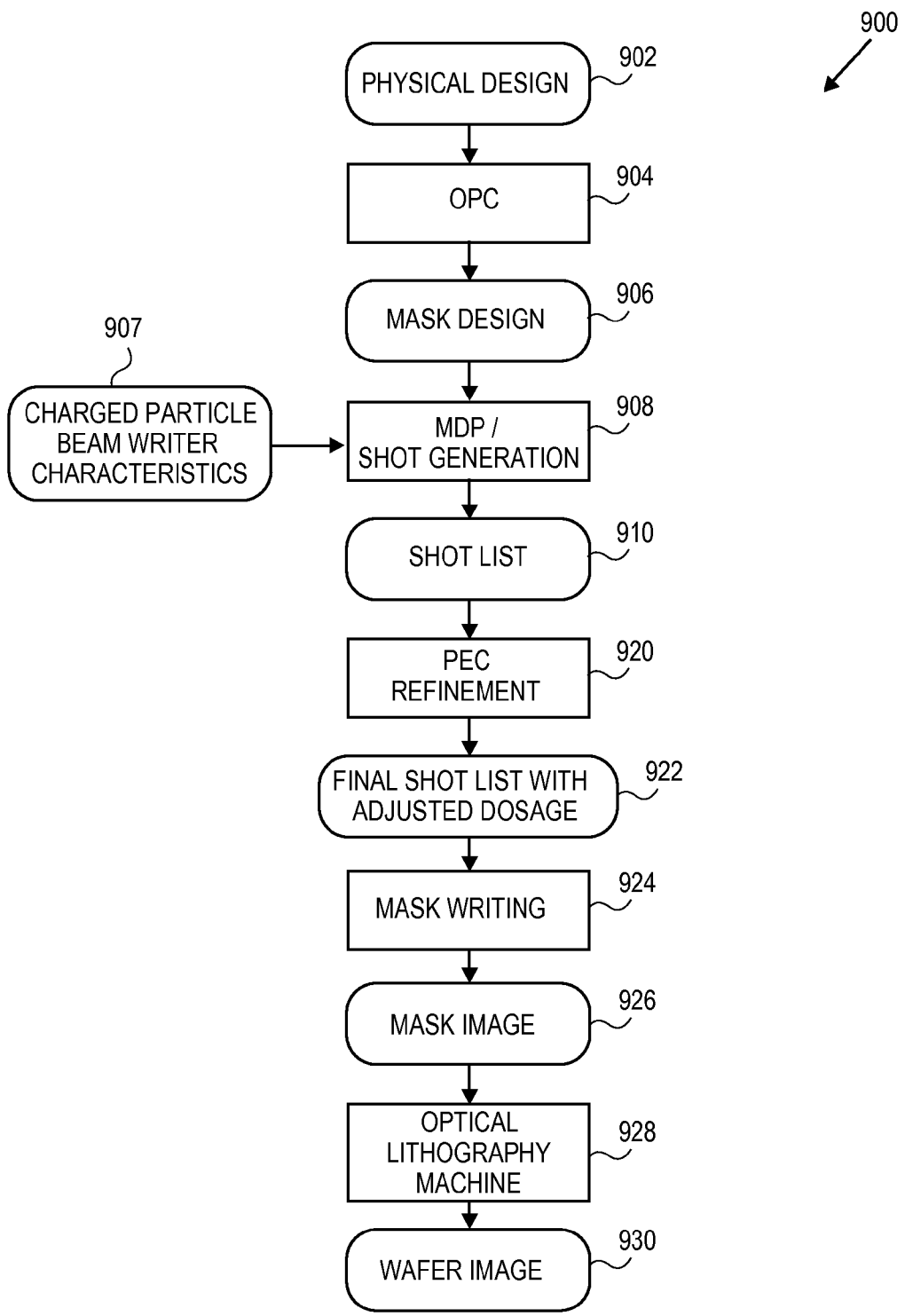
FIG. 9 illustrates a conceptual flow diagram of an exemplary method of how to prepare a surface, such as a reticle, for use in fabricating a substrate such as an integrated circuit on a silicon wafer using optical lithography.

FIG. 9 is a conceptual flow diagram 900 for forming patterns on a substrate such as a silicon wafer using optical lithography, according to an embodiment of the current disclosure. In a first step 902, a physical design, such as a physical design of an integrated circuit, is created. This can include determining the logic gates, transistors, metal layers, and other items that are required to be found in a physical design such as the physical design of an integrated circuit. Next, in a step 904, optical proximity correction (OPC) is done on the patterns in the physical design 902 or on a portion of the patterns in the physical design to create a mask design 906. OPC alters the physical design to compensate for distortions caused by effects such as optical diffraction and the optical interaction of proximate features. In step 908, the mask design 906 is fractured into a set of charged particle beam shots 910. Shots in shot list 910 may overlap. In some embodiments the shots in shot list 910 will be VSB shots. In other embodiments the shots in shot list 910 will be CP shots or a combination of VSB and CP shots. In other embodiments the shots in shot list 910 may be multi-beam shots, or a combination of multi-beam and other shaped beam shots. MDP 908 may comprise calculating the temperature that will be produced on the resist-coated substrate. MDP 908 may also comprise calculating a thermal variation or a thermally-induced CD variation. MDP 908 may also comprise splitting individual shots into a plurality of shots, where the plurality of shots may overlap and may be coincident, so as to reduce substrate heating and/or thermal variation. MDP 908 may also comprise ordering the shots in shot list 910 to reduce or minimize thermal variation. MDP 908 may also comprise lengthening the blanking period between a pair of shots from the minimum blanking time available with the charged particle beam writer, to reduce substrate heating and/or thermal variation. MDP 908 may input charged particle beam writer characteristics 907. The charged particle beam writer characteristics 907 may include information about how the charged particle beam writer will sequence or order a set of input shots. Shot list 910 may contain shots for one exposure pass or for multiple exposure passes. MDP 908 also may include mask process correction (MPC). MDP 908 outputs shot list 910.

In a proximity effect correction (PEC) refinement step 920, shot dosages may be adjusted to account for one or more long-range effects including backscatter, fogging, and loading, creating a final shot list with adjusted dosages 922. The final shot list with adjusted dosages 922 is used to generate a pattern on a surface in a mask writing step 924, which uses a charged particle beam writer such as an electron beam writer system. Depending on the type of charged particle beam writer being used, PEC refinement 920 may be performed by the charged particle beam writer. Mask writing step 924 may comprise a single exposure pass or multiple exposure passes. The electron beam writer system projects a beam of electrons through a stencil onto a surface to form a mask image comprising patterns on the surface as shown in a step 926. The completed surface may then be used in an optical lithography machine, which is shown in a step 928. Finally, in a step 930, an image on a substrate such as a silicon wafer is produced.

Figure 10:
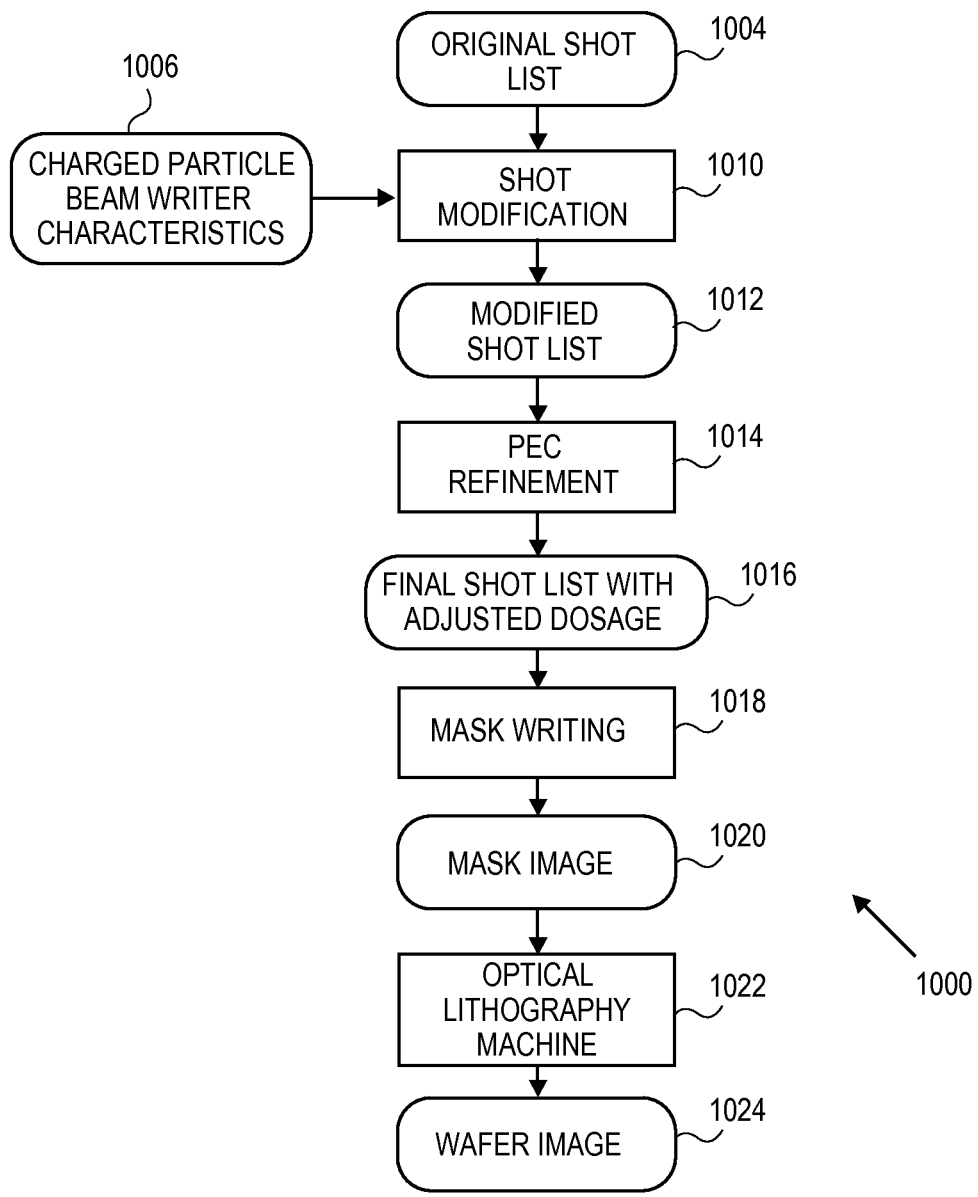
FIG. 10 illustrates a conceptual flow diagram of an exemplary method for verifying and/or modifying a pre-existing shot list to reduce thermally-induced CD variation.

FIG. 10 is a conceptual flow diagram 1000 for forming a pattern on a substrate such as a wafer, starting from a previously-generated shot list. Flow 1000 begins with a previously-generated original shot list 1004, which may comprise shots for one exposure pass or for multiple exposures passes. Shot list 1004 may be an ordered set of shots comprising a writing order. Shot modification 1010 inputs the original shot list 1004. Shot modification 1010 also inputs characteristics 1006 of the charged particle beam writer which will be used to write a mask in step 1018. Shot modification 1010 may comprise calculating a temperature that will be produced on the resist-coated substrate. Shot modification 1010 may also comprise calculating a thermal variation or a thermally-induced CD variation. Shot modification 1010 may also comprise splitting individual shots into a plurality of shots, where the plurality of shots may overlap and may be coincident, so as to reduce substrate heating or thermal variation. Shot modification 1010 may also comprise re-ordering the shots to reduce thermal variation and/or maximum substrate temperature. Shot modification 1010 may also comprise lengthening the blanking period between a pair of shots from the minimum blanking time available with the charged particle beam writer, to reduce substrate heating and/or thermal variation. Shot modification 1010 outputs a modified shot list 1012, which when written in step 1018, will have lower thermal variation than with original shot list 1004. Shot modification 1010 may also include mask process correction (MPC). In a proximity effect correction (PEC) refinement step 1014, shot dosages may be adjusted to account for one or more long-range effects including backscatter, fogging, and loading, creating a final shot list with adjusted dosage 1016. The final shot list with adjusted dosage 1016 is used to generate a surface in a mask writing step 1018, which uses a charged particle beam writer such as an electron beam writer system. Depending on the type of charged particle beam writer being used, PEC refinement 1014 may be performed by the charged particle beam writer. Mask writing step 1018 may comprise a single exposure pass or multiple exposure passes. The electron beam writer system projects a beam of electrons through a stencil onto a surface to form a mask image 1020 comprising patterns on the surface. After further processing steps, the completed surface may then be used in an optical lithography machine, which is shown in a step 1022, to produce an image on a substrate such as a silicon wafer 1024.

Figure 11:
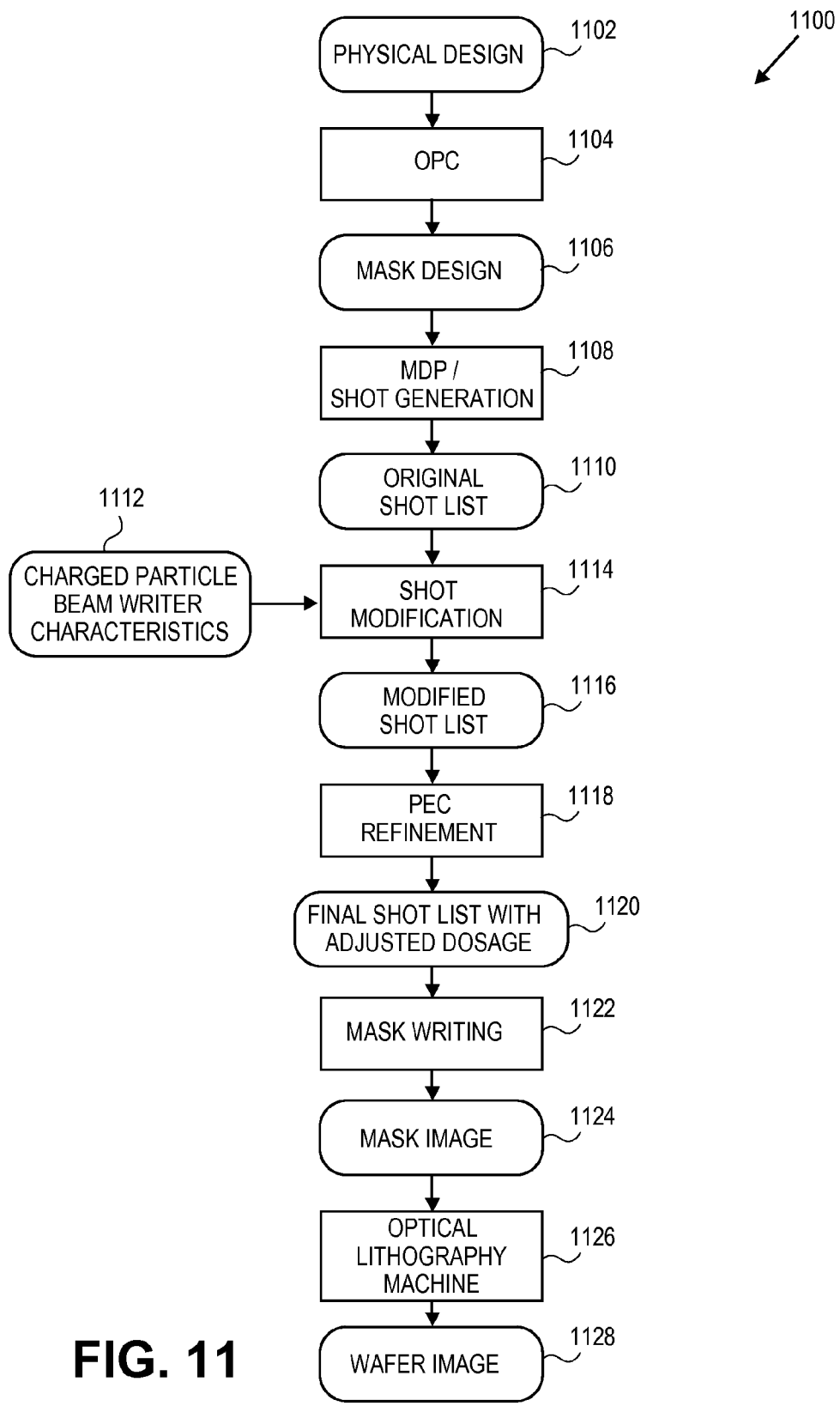
FIG. 11 illustrates a conceptual flow diagram of another exemplary method of how to prepare a surface, such as a reticle, for use in fabricating a substrate such as an integrated circuit on a silicon wafer using optical lithography.

FIG. 11 is a conceptual flow diagram 1100 for forming patterns on substrates such as a silicon wafer using optical lithography, according to another embodiment of the current disclosure. In a first step 1102, a physical design, such as a physical design of an integrated circuit, is created. This can include determining the logic gates, transistors, metal layers, and other items that are required to be found in a physical design such as the physical design of an integrated circuit. Next, in a step 1104, optical proximity correction (OPC) is done on the patterns in the physical design 1102 or on a portion of the patterns in the physical design to create a mask design 1106. OPC alters the physical design to compensate for distortions caused by effects such as optical diffraction and the optical interaction of proximate features. In MDP step 1108, the mask design 1106 is fractured into an original set of charged particle beam shots 1110. In some embodiments the shots in shot list 1110 will be VSB shots. In other embodiments the shots in shot list 1110 will be CP shots or a combination of VSB and CP shots. In other embodiments the shots in shot list 1110 may be multi-beam shots, or a combination of multi-beam and other shaped beam shots. Original shot list 1110 may comprise shots for a single exposure pass, or for multiple exposure passes. Original shot list 1110 may be an ordered set of shots comprising writing order.

Shot modification 1114 inputs the original shot list 1110. Shot modification 1114 may also input characteristics 1112 of the charged particle beam writer which will be used to write a mask in step 1122. Shot modification 1114 may comprise calculating a temperature that will be produced on the resist-coated substrate. Shot modification 1114 may also comprise calculating a thermal variation or a thermally-induced CD variation. Shot modification 1114 may also comprise splitting individual shots into a plurality of shots, where the plurality of shots may overlap and may be coincident, so as to reduce substrate heating or thermal variation. Shot modification 1114 may also comprise re-ordering the shots to reduce thermal variation. Shot modification 1114 may also comprise lengthening the blanking period between a pair of shots from the minimum blanking time available with the charged particle beam writer, to reduce substrate heating and/or thermal variation. Shot modification 1114 outputs a modified shot list 1116, which when written in step 1122, will have lower thermal variation than with original shot list 1110. Shot modification 1114 may also include mask process correction (MPC).

The modified shot list 1116 is read by a proximity effect correction (PEC) refinement step 1118, in which shot dosages may be adjusted to account for one or more long-range effects including backscatter, fogging, and loading, creating a final shot list with adjusted dosages 1120. The final shot list with adjusted dosages 1120 is used to generate a surface in a mask writing step 1122, which uses a charged particle beam writer such as an electron beam writer system. Depending on the type of charged particle beam writer being used, PEC refinement 1118 may be performed by the charged particle beam writer. Mask writing step 1122 may comprise a single exposure pass or multiple exposure passes. The electron beam writer system projects a beam of electrons through a stencil onto a surface to form a mask image 1124 comprising patterns on the surface. The completed surface may then be used in an optical lithography machine, which is shown in a step 1126. Finally, in a step 1128, an image on a substrate such as a silicon wafer is produced.

The calculations described or referred to in this disclosure may be accomplished in various ways. Generally, calculations may be accomplished by in-process, pre-process or post-process methods. In-process calculation involves performing a calculation at the time when its results are needed. Pre-process calculation involves pre-calculating and then storing results for later retrieval during a subsequent processing step, and may improve processing performance, particularly for calculations that may be repeated many times. Calculations may also be deferred from a processing step and then done in a later post-processing step. An example of pre-process calculation is pre-calculating a shot configuration that will produce a minimum CD variation for a given situation, and storing information about this shot configuration in a table. Another example of pre-process calculation is a shot group, which is a pre-calculation of dosage pattern information for one or more shots associated with a given input pattern or set of input pattern characteristics. The shot group and the associated input pattern may be saved in a library of pre-calculated shot groups, so that the set of shots comprising the shot group can be quickly generated for additional instances of the input pattern, without pattern re-calculation. In some embodiments, the pre-calculation may comprise simulation of the dosage pattern that the shot group will produce on a resist-coated surface. In other embodiments, the shot group may be determined without simulation, such as by using correct-by-construction techniques. In other embodiments the pre-calculation may comprise calculation of resist or substrate heating, or thermal variation. In some embodiments, the pre-calculated shot groups may be stored in the shot group library in the form of a list of shots. In other embodiments, the pre-calculated shot groups may be stored in the form of computer code that can generate shots for a specific type or types of input patterns. In yet other embodiments, a plurality of pre-calculated shot groups may be stored in the form of a table, where entries in the table correspond to various input patterns or input pattern characteristics such as pattern width, and where each table entry provides either a list of shots in the shot group, or information for how to generate the appropriate set of shots. Additionally, different shot groups may be stored in different forms in the shot group library. In some embodiments, the dosage pattern which a given shot group can produce may also be stored in the shot group library. In one embodiment, the dosage pattern may be stored as a two-dimensional (X and Y) dosage map called a glyph.

The fracturing, mask data preparation, shot list modification and pattern formation flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

Figure 12:
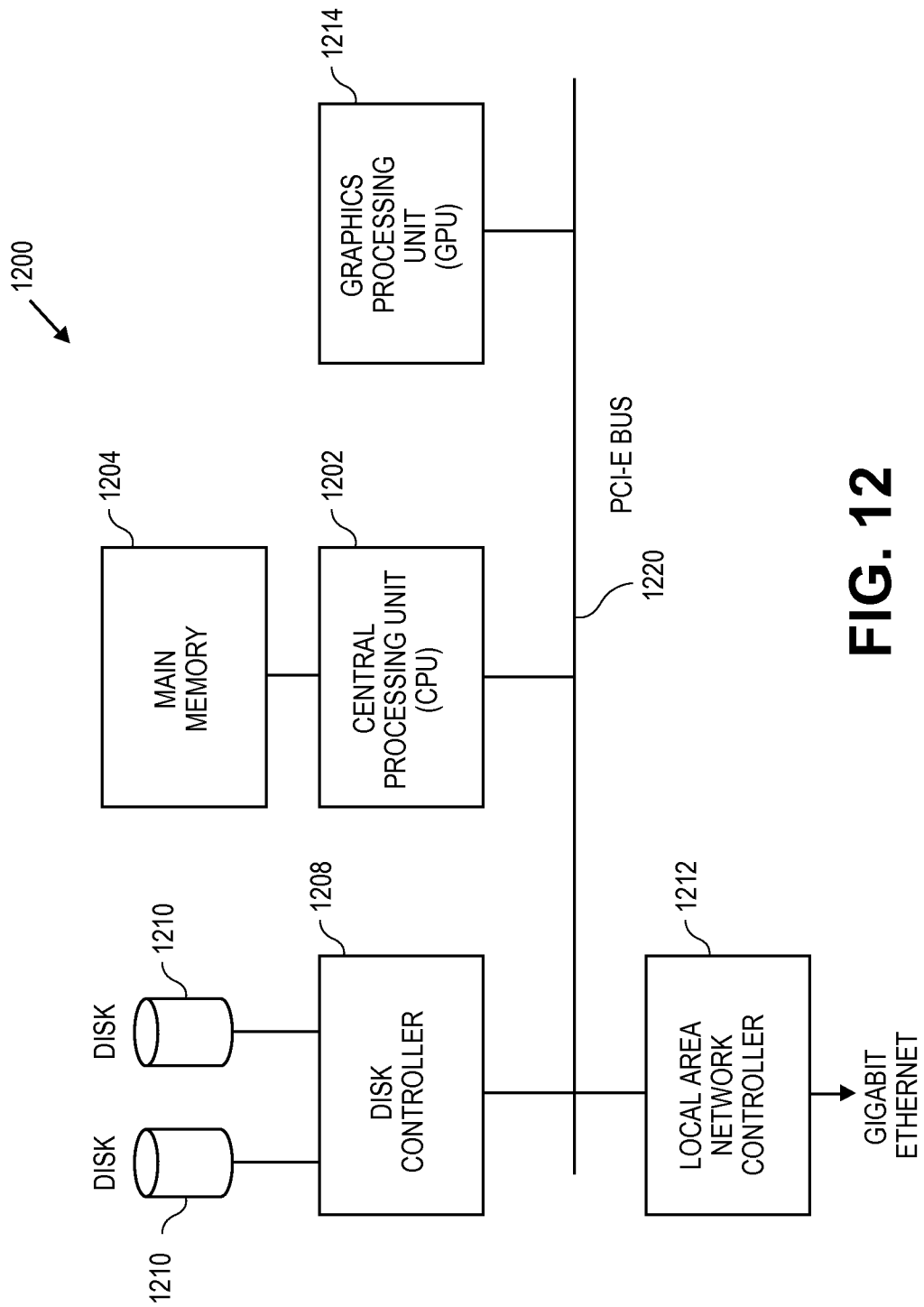
FIG. 12 illustrates an exemplary computing hardware device used in embodiments of the methods.

FIG. 12 illustrates an example of a computing hardware device 1200 that may be used to perform the calculations described in this disclosure. Computing hardware device 1200 comprises a central processing unit (CPU) 1202, with attached main memory 1204. The CPU may comprise, for example, eight processing cores, thereby enhancing performance of any parts of the computer software that are multi-threaded. The size of main memory 1204 may be, for example, 64 G-bytes. The CPU 1202 is connected to a Peripheral Component Interconnect Express (PCIe) bus 1220. A graphics processing unit (GPU) 1214 is also connected to the PCIe bus. In computing hardware device 1200 the GPU 1214 may or may not be connected to a graphics output device such as a video monitor. If not connected to a graphics output device, GPU 1214 may be used purely as a high-speed parallel computation engine. The computing software may obtain significantly-higher performance by using the GPU for a portion of the calculations, compared to using CPU 1202 for all the calculations. The CPU 1202 communicates with the GPU 1214 via PCIe bus 1220. In other embodiments (not illustrated) GPU 1214 may be integrated with CPU 1202, rather than being connected to PCIe bus 1220. Disk controller 1208 may also be attached to the PCIe bus, with, for example, two disks 1210 connected to disk controller 1208. Finally, a local area network (LAN) controller 1212 may also be attached to the PCIe bus, and provides Gigabit Ethernet (GbE) connectivity to other computers. In some embodiments, the computer software and/or the design data are stored on disks 1210. In other embodiments, either the computer programs or the design data or both the computer programs and the design data may be accessed from other computers or file serving hardware via the GbE Ethernet.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, shot list modification, and forming a pattern on a surface may be practiced by those of ordinary skill in the art, without departing from the scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for forming a pattern on a surface using charged particle beam lithography, the method comprising:
inputting an ordered set of input shots for at least one subfield of a shaped beam charged particle beam writer; and
modifying the ordered set of input shots within a subfield to reduce either a thermal variation or a maximum temperature of the surface during exposure by the charged particle beam writer,
wherein the modifying is performed by a computing hardware device.

2. The method of claim 1 wherein the modifying comprises replacing an original shot in the ordered set of input shots with a plurality of replacement shots.

3. The method of claim 2 wherein at least two of the replacement shots overlap each other.

4. The method of claim 2 wherein each of the replacement shots is coincident with the original shot.

5. The method of claim 2 wherein the modifying further comprises interposing an input shot other than the original shot between a pair of shots in the plurality of replacement shots.

6. The method of claim 1, further comprising writing the pattern on the surface with the modified ordered set of shots.

7. The method of claim 6 wherein the surface is a resist-coated reticle.

8. The method of claim 1 wherein the modifying comprises re-ordering shots in the ordered set of shots.

9. The method of claim 1 wherein the ordered set of shots comprises a plurality of groups of shots, wherein each group of shots comprises at least two shots, and wherein the modifying comprises re-ordering the groups of shots.

10. The method of claim 1 wherein modifying the ordered set of shots reduces the thermal variation by increasing a minimum temperature of the surface during exposure by the charged particle beam writer.

11. The method of claim 1 wherein each shot in the ordered set of input shots comprises a variable shaped beam (VSB) shot.

12. The method of claim 1 wherein a shot in the ordered set of input shots comprises a multi-beam shot.

13. The method of claim 1 wherein the modifying comprises calculating the thermal variation of the surface from the ordered set of input shots.

14. The method of claim 1 wherein a CD variation of the modified ordered set of shots is reduced compared to the ordered set of input shots.

15. The method of claim 1 wherein the modifying comprises calculating the temperature of the surface from the ordered set of input shots.

16. A method for forming a pattern on a surface using charged particle beam lithography, the method comprising:
inputting an ordered set of input shots for a shaped beam charged particle beamwriter, wherein each shot in the ordered set of input shots is followed by a blanking period; and
lengthening the blanking period following a shot in the ordered set of input shots to reduce the maximum temperature of the surface during exposure by the charged particle beam,
wherein the lengthening is performed by a computing hardware device.

17. The method of claim 16 further comprising calculating the maximum temperature of the surface from the ordered set of input shots.

18. A method for fracturing or mask data processing (MDP), the method comprising:
generating an ordered set of shots for a predetermined number of exposure passes for exposing at least one subfield of a surface using a shaped beam charged particle beam writer,
wherein a temperature or a thermal variation generated on the surface during the exposure of one subfield in the at least one subfield with the ordered set of shots is calculated, and
wherein the generating is performed by a computing hardware device.

19. The method of claim 18 wherein the generating comprises:
generating a preliminary ordered set of shots;
determining that an original shot in the preliminary ordered set of shots causes the temperature on the surface to exceed a predetermined maximum temperature; and
modifying the preliminary ordered set of shots by replacing the original shot with a plurality of replacement shots, wherein the replacement shots overlap each other.

20. The method of claim 18 wherein the generating comprises:
generating a preliminary ordered set of shots;
determining that an original shot in the preliminary ordered set of shots causes the temperature on the surface to exceed a predetermined maximum temperature; and
modifying the preliminary ordered set of shots by changing the order of at least two shots in the preliminary ordered set of shots.

* * * * *